(12) United States Patent
Leuschner et al.

(10) Patent No.: US 6,696,315 B2
(45) Date of Patent: Feb. 24, 2004

(54) SEMICONDUCTOR DEVICE CONFIGURATION WITH CAVITIES OF SUBMICROMETER DIMENSIONS AND METHOD OF FABRICATING STRUCTURED CAVITIES

(75) Inventors: Rainer Leuschner, Mohegan Lake, NY (US); Egon Mergenthaler, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/231,785

(22) Filed: Aug. 29, 2002

(65) Prior Publication Data

US 2003/0080430 A1 May 1, 2003

(30) Foreign Application Priority Data

Aug. 29, 2001 (DE) .......................................... 101 42 223

(51) Int. Cl.⁷ .......................... H01L 21/76; H01L 51/40
(52) U.S. Cl. .......................... 438/99; 438/400; 438/421; 438/623
(58) Field of Search .......................... 438/99, 400, 421, 438/619, 622, 623, 758

(56) References Cited

U.S. PATENT DOCUMENTS

| | | | |
|---|---|---|---|
| 5,338,975 A | * | 8/1994 | Cole et al. ................. 257/750 |
| 5,599,745 A | | 2/1997 | Reinberg |
| 5,668,398 A | | 9/1997 | Havemann et al. |
| 5,783,481 A | | 7/1998 | Brennan et al. |
| 6,165,890 A | | 12/2000 | Kohl et al. |
| 6,251,798 B1 | * | 6/2001 | Soo et al. ................. 438/758 |
| 6,268,277 B1 | | 7/2001 | Bang |
| 6,284,675 B1 | * | 9/2001 | Jin et al. ................. 438/778 |
| 6,413,882 B1 | * | 7/2002 | Leung et al. ............. 438/781 |
| 6,610,593 B2 | * | 8/2003 | Kohl et al. ................ 438/623 |

FOREIGN PATENT DOCUMENTS

| | | |
|---|---|---|
| WO | WO 97/39484 | 10/1997 |
| WO | WO 00/51177 | 8/2000 |

OTHER PUBLICATIONS

Shieh et al. "Air–Gap Formation During IMD Deposition to Lower Interconnect Capacitance", IEEE Electron Device Letters, vol. 19, No. 1, Jan. 1998, pp. 16–18.
Fleming et al. "Use of Air Gap Structures to Lower Intralevel Capacitance", DUMIC Conference, Feb. 1997, pp. 139–145.
Ueda et al. "A Novel Air Gap Integration Scheme for Multi–Level Interconnects Using Self–Aligned Via Plugs", 1998 Symposium on VLSI Technology Digest of Technical Papers, pp. 46–47.
Anand et al. "NURA: A Feasible, Gas–Dielectric Interconnect Process", 1996 Symposium on VLSI Digest of Technical Papers, pp. 82–83.
Shieh et al. "Air Gaps Lower k of Interconnect Dielectrics", Solid State Technology, Feb. 1999, pp. 51–55.
Hong et al., "The Effect of sol Viscosity on the sol–gel Derived Low Density $SiO_2$ Xerogel Film for Intermetal Dielectric Application", Elsevier, Thin Solid Films 332, 1998, pp. 449–454.

* cited by examiner

Primary Examiner—Craig Thompson
Assistant Examiner—David S Blum
(74) Attorney, Agent, or Firm—Laurence A. Greenberg; Werner H. Stemer; Gregory L. Mayback (57) ABSTRACT

Cavities of submicron dimension are in a cavity layer of a semiconductor device. For that purpose, processing material is deposited on ridges of a working layer that is structured from ridges and trenches. The processing material is polymerized and the polymerizing processing material expands over the trenches. Upon covering the trenches, the submicron cavities are formed.

30 Claims, 4 Drawing Sheets

SEMICONDUCTOR DEVICE CONFIGURATION WITH CAVITIES OF SUBMICROMETER DIMENSIONS AND METHOD OF FABRICATING STRUCTURED CAVITIES

BACKGROUND OF THE INVENTION

1. Field of the Invention

The invention lies in the semiconductor technology field. More specifically, the present invention relates to a method of creating cavities that are structured in submicrometer dimensions in a cavity layer of a semiconductor device by polymerization, and to a configuration which is produced by the method, with cavities that are structured in submicrometer (submicron) dimensions in a semiconductor device.

Inside a semiconductor device, conductive tracks are capacitively coupled to one another both within an interconnect layer (intralevel) and between different interconnect layers (interlevel). Such capacitive coupling between conductive tracks leads to crosstalk and to extended signal transit times.

In order to minimize these disruptive effects, the conductive tracks are decoupled from one another as much as possible by minimizing the capacitance between them. Given a defined spacing between two conductive tracks, this requires an optimally low permittivity of the material between the conductive tracks. Gaseous substances such as air have an almost optimal permittivity of near 1 at normal pressure, whereas the permittivity of solid bodies is usually substantially higher.

For this reason, in semiconductor devices it is generally desirable to decouple two tracks from one another by air-filled cavities. The prior art methods for creating such air gaps will be described below. All these methods presume a working layer which has already been structured by ridges and trenches.

Conductive tracks can functionally emerge from the ridges of the working layer. The trenches of the working layer are cavities which have not yet been covered. Accordingly, an interconnect layer is one possible embodiment of a cavity layer that emerges from a working layer, but not the only one.

According to a first method, the trenches are filled with porous materials such as xerogels or aerogels and then covered with a dielectric coverlayer. The air that is trapped in the pores lowers the overall permittivity of the material between the tracks. Such porous materials are in the evaluation phase at present. The disadvantages of these methods are the water absorption owing to the capillary effect of the open-pored structures, and the relatively long processing times. Furthermore, filling the cavities with material of the xerogels and aerogels raises the permittivity of the cavity relative to a pure air fill. The utilization of aerogels as dielectric materials with low permittivity is described in "The Effect of Sol Viscosity on the Sol-Gel Derived Low-Density SiO.sub.2 Xerogel Film For Intermetal Dielectric Application" (*Thin Solid Films*, vol. 332, pages 449–54, 1998).

A second method is to cover trenches by conventional $SiO_2$-CVD-processes (Chemical Vapor Deposition) with a high deposition rate.

A first variant of such a method is described in "Air-Gap Formation During IMD Deposition to Lower Interconnect Capacitance" (B. P. Shieh, *IEEE Electron Device Letters*, vol. 19, no. 1, pp. 16–18, January 1998). But gaps which are generated in this fashion extend into the $SiO_2$ coverlayer (cap formation). In subsequent CMP processes, the underlying cavities can be opened, and neighboring conductive tracks can be shorted by a subsequent metallization in these open cavities. If the $SiO_2$ layer is deposited with sufficient thickness to prevent a subsequent opening of the cavities, then the problem of contacting underlying tracks by way of sufficiently deep vias arises.

In a variant of this method which is described in "A Novel Air Gap Integration Scheme for Multi-Level Interconnects Using Self-Aligned Via Plugs" (T. Ueda, *Symp. on VLSI Technology*, pp. 46, 47, June 1998), the covering of the trenches is a two-stage process. In a first stage, $SiO_2$ is deposited on the horizontal surfaces of the ridges with a PECVD (Plasma Enhanced Chemical Vapor Deposition) method. Narrow trenches are thus covered by $SiO_2$ that grows on both sides of the trenches on the surfaces of the ridges. In an HDP-CVD process (High Density Plasma CVD), wider trenches are then filled with $SiO_2$ and narrow trenches are sealed with $SiO_2$.

According to a third method, as described in "Use of Air-Gap Structures to Lower Intralevel Capacitance" (J. G. Fleming, E. Roherty-Osmum, *Proc. DUMIC*, pp. 139–45, 1997), spin-on materials are employed for covering the cavities between the tracks. The disadvantage of that method is the backflow of the materials into the cavities.

A fourth method is described in PCT publication WO 97/39484 A1 (Rosenmayer, Noddin). A film is laid on the interconnect layer that is structured by trenches and ridges. Such a film has a thickness of at least several micrometers, so that it can be safely processed. This gives rise to large spacings between the interconnect planes as described above, with the described disadvantages in connection with through-contacting by means of vias.

A fifth method, described in U.S. Pat. No. 6,165,890 (Kohl), is the retropoly-merization of polynorbornene, which temporarily fills the cavities between the interconnects. In this method, unavoidable residues of the retropolymerization can lead to clusters that pose a short-circuiting risk. Furthermore, the selection of the dielectric material between interconnect layers is limited, because the material must be permeable to the volatile substances that emerge in the retropolymerization.

Similar disadvantages arise in a sixth method, the thermal decomposition of a temporary filling of the cavities between the conductive tracks. An example of a thermal decomposition of a temporary filling with a photoresist is described in U.S. Pat. No. 5,668,398 (Havemann). The oxidation of a temporary carbon layer is described in "NURA: A Feasible Gas Dielectric Interconnect Process" (M. B. Anand, M. Yamada, H. Shibata, *Symp. on VLSI Technology*, pp. 82, 83, June 1996). In both cases, the substances which emerge in the decomposition must be expelled through the coverlayer, which limits the material selection. The undecomposable residues in the cavities raise the permittivity, thereby reducing the resistance to shorting. According to another known example of the decomposition of a temporary filling, which is described in the PCT publication WO 00/51177 (Werner, Pellerin), the coverlayer is perforated prior to the decomposition of the filling in order to accelerate and thus improve the expulsion of the decomposition residues.

According to a seventh method, described in U.S. Pat. No. 5,599,745 (Reinberg), a dielectric layer is deposited on the ridges that are formed by the conductive tracks, this is melted enough that this layer arches over the track, and arches of the coverlayer of closely adjacent tracks ultimately touch, bridging the trenches between them.

An eighth method for generating air gaps is described in U.S. Pat. No. 6,251,798 B1 (Soo et al.). There, in a first step a plasma-polymerized methyl silane is deposited on a structure consisting of metal ridges such that it also fills the intermediate spaces between the metal ridges. The layer of plasma-polymerized methyl silane over the metal ridges is cured in sections by exposure. The plasma-polymerized methyl silane over the intermediate spaces between the metal ridges is partly covered during exposure, so that channels consisting of uncured plasma-polymerized methyl silane are formed from the surface to the spaces between the metallized ridges, which spaces are filled with uncured plasma-polymerized methyl silane. In a subsequent etching step, the uncured plasma-polymerized methyl silane is selectively etched against the cured plasma-polymerized methyl silane. It is removed also from the spaces between metallized ridges by way of the channels.

The disadvantage of this method is, first, that the curing must be adapted to the thickness of the deposited plasma-polymerized methyl silane layer. Furthermore, the plasma-polymerized methyl silane layer must be provided with a thickness of at least some 500 nanometers in order to achieve sufficient mechanical stability of the layer.

Similarly, according to a ninth method, described in U.S. Pat. No. 6,268,277 (Bang), spaces between metallized ridges are etched through channels that are provided in a coverlayer. But such techniques already require coverlayers which are sufficiently stable even in a perforated condition. Besides, the photolithographic processes which are needed for constructing the etch channels in the coverlayer must manage smaller structural dimensions than are needed for constructing the ridges in the cavity layer. Because the coverlayer must furthermore comprise a layer thickness of several 100 nanometers, the etch channels are also relatively long given a small diameter, and thus etching residues remain in the formed cavities.

In a tenth method for forming air gaps, a polyimide is deposited surface-wide on a layer which has been structured by trenches and ridges. In a subsequent processing step, additional dielectric material is deposited on the polyimide. The dielectric material is deposited in a first step at a temperature at which significant outgassing from the polyimide occurs. With the outgassing, cavities form between the polyimide layer and the overlying dielectric material. But the spaces between metallized ridges cannot be realized as even close to completely empty cavities with this rather simple method which requires no further structuring measures. That method is described in U.S. Pat. No. 5,783,481 (Brennan).

The article "Air Gaps Lower K Of Interconnect Dielectrics" (Ben Shieh, Krishna Saraswat, Mike Deal, Jim McVittie, *Solid State Technology*, February 1999) contains a summary of known methods for generating air gaps in a semiconductor substrate, together with an appraisal of the results they achieve.

To summarize, the disadvantages of the described methods are rooted in:
residues in the cavities, which raise the permittivity and/or diminish the resistance to shorting;
the required thickness of the layer covering the trenches and the associated difficulty in realizing vias;
the process integration.

SUMMARY OF THE INVENTION

It is accordingly an object of the invention to provide a method with which structured cavities with submicrometer dimensions can be created in a cavity layer of a semiconductor device, which overcomes the above-mentioned disadvantages of the heretofore-known devices and methods of this general type and which, while providing the possibility of utilizing process techniques, materials and means that are common in semiconductor processing technology, advantageously leads to cavities that are free of residues, and a layer that covers the cavity layer with a thickness that does not exceed one micrometer.

With the foregoing and other objects in view there is provided, in accordance with the invention, a method of forming structured cavities with submicrometer (submicron) dimensions in a cavity layer of a semiconductor device, which comprises the following steps:
depositing an initially compact working layer on a base layer, the working layer being formed, at least in sections thereof, of a working material;
depositing a processing layer on the compact working layer to form a double layer from the working layer and the processing layer, the processing layer containing polymerizable processing material;
structuring the double layer to form ridges of submicrometer dimensions of the working material covered by the processing material, and to form trenches between the ridges;
polymerizing the processing material and growing additional material on mutually adjacent ridges, to cover respective trenches between the ridges, and forming cavities; and
expelling processing residue from the cavities.

In other words, the objects of the invention are achieved with the following numbered method steps:
(1) deposit an initially compact working layer, which consists of a working material at least in sections, on a base layer;
(2) deposit a processing layer on the compact working layer, whereby a double layer emerges from the working layer and the processing layer, and whereby the processing layer comprises at least one active processing sublayer consisting of a polymerizable processing material
(3) structure the double layer, creating ridges with submicrometer dimensions from the working material, which are covered at least by the processing material, and between the ridges, trenches;
(4) control a polymerization of the processing material, whereby additional material grows on the processing material on neighboring ridges, such that trenches between the ridges are covered and cavities are formed; and
(5) expel processing residues from the cavities.

In the inventive method, an initially compact working layer is deposited on a base layer, and a processing layer is deposited on the working layer, so that a double layer composed of the working layer and the processing layer emerges.

The processing layer can be composed of several processing sublayers. But in any case it comprises at least one active processing sublayer consisting of a polymerizable processing material. The active processing sublayer preferably lies directly on the working layer.

The double layer consisting of the processing and working layers is then structured. There emerge ridges consisting of a working material, which are covered at least by the processing material, and between the ridges, trenches. The ridges and trenches have submicrometer dimensions.

Residual portions of the processing material are suitably prepared so that they excite a subsequent polymerization, preferably in the lateral direction parallel to the base layer, wherein material grows on the processing material.

A first method of achieving this is to cover the active processing sublayer with a passive processing sublayer in the vertical direction parallel to the base layer.

The active processing sublayer is thus shielded at the surfaces parallel to the base layer, while side surfaces on the flanks of the ridges remain clear. This way, additional material can be selectively grown.

A second method is to reinforce the surface of the active processing sublayer opposite the working layer, so that the growth of material at this surface during a polymerization process is inhibited. In this case, the active processing sublayer can also be the only processing sublayer of the processing layer.

The polymerization of the processing material occurs in a controlled fashion. The processing material expands primarily parallel to the base layer. The layers of the processing material on neighboring ridges thus grow toward one another and ultimately cover the trenches.

The polymerization is interrupted as soon as the overhanging expanding processing material covers trenches whose width is less than a maximum cover-width.

Cavities emerge with the covering of the trenches and the removal of processing residues from the trenches.

The base layer is advantageously constructed as an etch stop layer which is resistant to the etching of the working layer. The material of the working layer can be completely removed in etched portions without having to make further demands on a process control, for instance with respect to controlling the etching period. This simplifies the structuring of the working layer.

If the material of the ridges of the working layer is a conductive material such as copper, then a cavity layer which is developed from the working layer is realized as an interconnect layer.

On the other hand, if the cavity layer is intended for a capacitive decoupling of two interconnect layers, then a dielectric material with low permittivity is selected as the material of the ridges.

The trenches in the working layer reach the base layer, in order to achieve an optimally high overall permittivity between neighboring ridges that are realized as conductive tracks.

The polymerization is advantageously performed as graft polymerization.

The structuring of the double layer consisting of the compact working layer and the processing layer can be performed in various ways.

A first method starts with a compact, homogenously developed working layer consisting of the conductive material, and on this, a processing layer.

A photoresist is deposited on the processing layer and structured. Next, the structure of the photoresist is imaged onto the processing layer, and then the structure of the processing layer is imaged onto the working layer.

The photoresist is advantageously used up in the structuring of the working layer. But it can also be removed in a separate step or can remain on the processing layer.

The material of the processing layer is advantageously a fluorinated hydrocarbon (a-C:H(F)).

The processing layer is usually structured with an etching method. Therefore, after the photoresist is structured, the etch resistance of its residual-portions is reinforced.

The reinforcing is advantageously accomplished by sylation.

A group containing silicon is thereby incorporated into the photoresist. The photoresist includes corresponding reactive groups.

A second method for structuring the double layer of the working and processing layers starts with a compact working layer which is prestructured from the working material and an auxiliary material by the customary technique. The prestructured working layer already includes first portions consisting of the working material and second portions which consist of the auxiliary material. The ridges will be formed from the first portions, and the trenches will be formed from the second portions. At the surface of the working layer opposite the base layer, the working layer comprises a working surface, which is formed in sections from the surfaces of the first portions (which consist of the auxiliary material) and the surfaces of the second portions (which consist of the working material).

In a first step of the second method for structuring the double layer of working and processing layers, the processing layer is structured in such a way that it remains on portions of the working surface formed from the working material and is removed from the portions of the working surface formed from the auxiliary material.

Next, in a second step, the auxiliary material is removed.

In a first variant of the structuring of the processing layer on a prestructured working layer in the course of structuring a double layer of the processing and working layers, the processing material is a positive photoresist which is suitable for polymerization.

The structuring of the processing layer then occurs directly by lithography. Surfaces of residual portions of the processing layer opposite the working layer can be reinforced so that a subsequent polymerization advantageously occurs laterally—on the surfaces oriented vertical to the base layer, which were cleared by the structuring—and thus parallel to the base layer.

In a second variant of the structuring of the processing layer on a prestructured working layer in the course of the structuring of a double layer of the processing and working layers, the processing layer is provided in the form of an active processing sublayer consisting of a polymerizable processing material and a passive processing sublayer. The active processing sublayer lies on the working layer, and the passive processing sublayer lies on the active processing sublayer. The passive processing-sublayer is inert to polymerization. It consists of an amorphous hydrocarbon layer (a-C:H), for instance.

The structuring is achieved by depositing, exposing and developing an auxiliary photoresist according to the structure of the working layer. Residual portions of the auxiliary photoresist remain over the first portions, which will be developed into ridges, of the prestructured working layer consisting of the working material and are separated from said first portions by the processing layer.

The structure of the auxiliary photoresist is then transferred into the processing layer.

The removal of the auxiliary photoresist is advantageously accomplished during the removal of the auxiliary material from the working layer. A plasma which erodes both the auxiliary photoresist and the auxiliary material is used for this.

But the auxiliary photoresist can also be removed in a separate step before or after the auxiliary material is removed. Its residual portions can also remain on the processing layer if the material of the auxiliary photoresist is a material of low permittivity and can be processed the same way as a subsequently applied coverlayer in a later etching process, for instance for generating vias.

The active processing sublayer in this variant advantageously comprises a sensitizer. The sensitizer is advantageously a benzophenone, benzopyrone, or thioxanthone derivative.

The passive processing sublayer is an amorphous hydrocarbon which protects the active processing sublayer during the developing of the overlying auxiliary photoresist and/or which inhibits a subsequent polymerization of the active processing sublayer in a vertical direction perpendicular to the base layer.

The etch resistance of the auxiliary photoresist can be reinforced after the developing process.

With the above described methods and variants, a structure with submicrometer dimensions consisting of ridges and trenches is generated in the working layer. The ridges bear caps consisting of the material or materials of the processing layer, which can take one of the following forms, depending on the method applied for structuring the double layer of working and processing layers:

- a single-layer cap consisting of a polymerizable material, whereby the surface of the cap opposite the working layer is prepared such that it polymerizes little if at all;
- double-layer cap, whereby an additional non-polymerizable sublayer lies on a bottom polymerizable sublayer and impedes growth vertical to the base layer.

Proceeding from such a structure of at least double-layer ridges on the base layer, in the next stage of the inventive method a polymerization of the processing material is controlled.

In a first substep, the polymerization is triggered, and in a second substep it is perpetuated.

The sequence of initiation and perpetuation constitutes a process cycle that is repeated until the processing material on the ridges, which expands in an overhanging fashion owing to the incorporation of monomers, covers trenches between neighboring ridges whose width at their top edge is less than a maximum cover width.

In a first preferred technique, the polymerization is triggered by exposure of the processing material.

In a second preferred technique, the polymerization is initiated by radical starter compounds.

According to a first embodiment of the inventive method, the monomers are supplied in the gas phase.

According to a second embodiment, the monomers are applied to the processing material in a solution.

The polymerization is ended by heating to a first temperature.

In the polymerization, monomers and if in solution, the solvent—are trapped in cavities that emerged with the covering of the trenches. These processing residues can be expelled from the cavities by heating to a second temperature.

The first and second temperatures are advantageously the same, so that both processes occur in one step.

A coverlayer consisting of a dielectric material with low permittivity can be deposited on the polymerized processing layer (which is typically only 20–200 nm thick) in the next processing stage. The dielectric material is advantageously an organic dielectric material. This can be polybenzoxazole, polyaryl ether, hydrogen silsesquioxane, a fluorinated organic silica CVD film or a fluorinated or non-fluorinated hydrocarbon. Vias can then be etched into the double layer of the polymerized processing layer and the coverlayer (which is composed of an organic dielectric material) by the same means in one processing step.

Silicon dioxide is also a suitable material for the coverlayer.

The capacitive coupling of two conductive tracks which are developed from ridges is dependent on the permittivity of the material separating the tracks and the spacing of the tracks from one another. Given a greater spacing of the tracks, a higher permittivity of the material between the tracks can be allowed in order to achieve the same capacitive coupling.

Given a large spacing of neighboring ridges, to the extent that trenches are not covered by expanding processing material and are filled with a material of low permittivity, there is no disadvantage to such open structures in practice.

A semiconductor device which has near ideal cavities in a cavity layer is generated with the inventive method. The cavities have close to the lowest possible permittivity. Conductive tracks that are developed from ridges which adjoin such cavities are decoupled from one another to the greatest possible extent.

With the above and other objects in view there is also provided, in accordance with the invention, a configuration in a semiconductor device, comprising:

a base layer;
a cavity layer on said base layer, said cavity layer being structured in submicrometer dimensions with ridges of a working material and cavities therebetween; and
a processing layer formed of a cured polymer supported on said ridges and covering said cavities, said processing layer having a thickness of less than 100 nanometers.

In other words, the configuration in the semiconductor device comprises a base layer; a cavity layer on the base layer, with a structure with submicrometer dimensions, which consists of ridges of a working material and cavities; and a polymerized processing layer on the ridges, which covers the cavities.

In accordance with an added feature of the invention, the processing layer advantageously has a thickness of less than 100 nanometers.

The base layer advantageously consists of an etch stop layer such as silicon nitride.

In an advantageous variant of the configuration according to the invention, the ridges consist of a conductive material, particularly of copper.

The configuration can be expanded by a coverlayer which lies on the polymerized processing layer.

The coverlayer advantageously consists of an organic dielectric material, so that the coverlayer and the processing layer can be processed by the same means, for instance during the subsequent creation of vias.

Other features which are considered as characteristic for the invention are set forth in the appended claims.

Although the invention is illustrated and described herein as embodied in a method and a device with cavities having submicrometer dimensions in a semiconductor device which are generated by polymerization, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
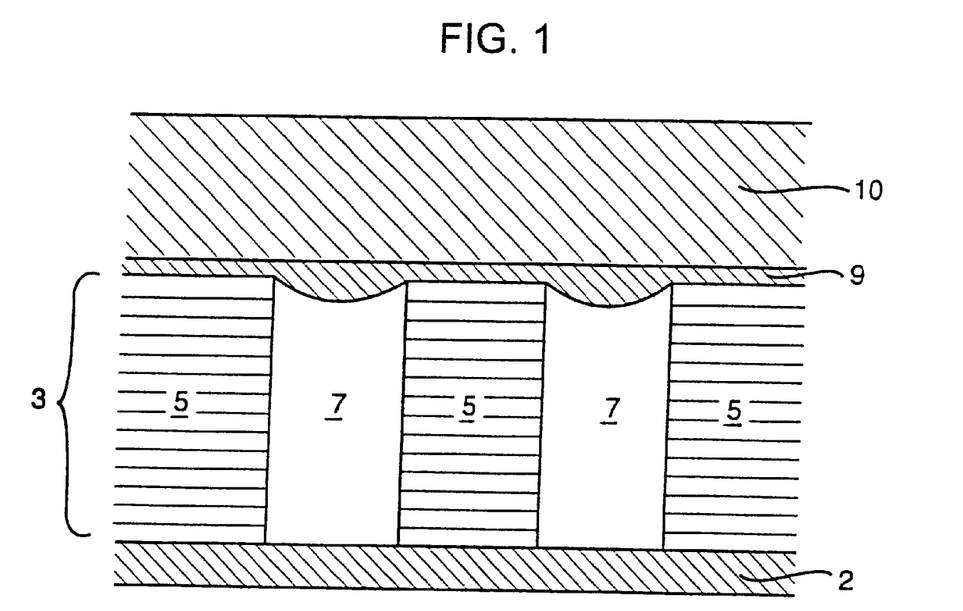
FIG. 1: a schematic cross-section through a section of a configuration according to the invention.

Referring now to the figures of the drawing in detail and first, particularly, to FIG. 1 thereof, there is shown an exemplary embodiment with a cavity layer 3 formed with three parallel ridges 5 of a conductive material and two intermediate cavities 7. The cavities 7 are sealed below by a base layer 2 and above by a polymerized processing layer 9. In this exemplary embodiment, a coverlayer 10 of an organic dielectric material is located on the processing layer 9. The ridges 5 and the cavities 7 have submicrometer dimensions. The coverlayer 10 has a thickness between 40 and 100 nm.

The various subfigures of FIG. 2 represent the novel method in a first embodiment. Here, a working layer 1 is deposited as a compact prestructured working layer on a base layer 2, and the monomers are supplied as a processing gas during the polymerization.

Figure 2A:
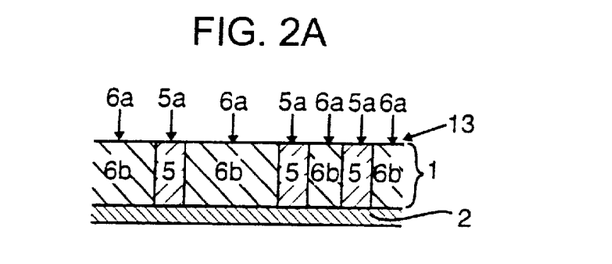
FIG. 2: a schematic representation of the essential steps of a first embodiment of the inventive method.

FIG. 2A represents an initially still compact prestructured working layer 1 which is deposited on a base layer 2. First portions 5 consisting of the working material are already provided in the working layer 1 in submicrometer dimensions, from which ridges 5 will subsequently be developed. Trenches 6 and later cavities 7 will be formed from second portions 6b which are located between the first portions 5 and which are filled with an auxiliary material. On the surface of the working layer opposite the base layer 2, a working surface 13 is constructed, which is formed in sections from the surfaces 5a of the first portions 5 and the surfaces 6a of the second portions 6b.

Figure 2B:
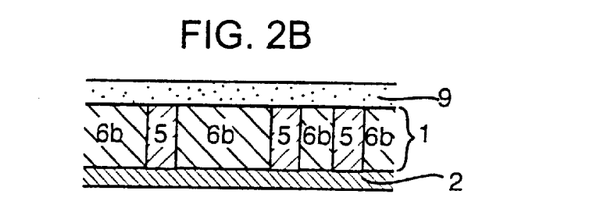

A processing layer 9 consisting of a processing material is deposited on the working surface 13. The result of this step is represented in FIG. 2B.

In the first embodiment of the novel method, the processing material is a polymerizable positive photoresist which is structured in the next step by lithography, i.e. exposed and developed. The structuring is performed in such a way that, after the developing process, the processing material remains on the sections of the working surface 13 formed by the surfaces 5a of the first portions 5 and is removed from the the surfaces 6a of the second portions 6b.

Figure 2C:
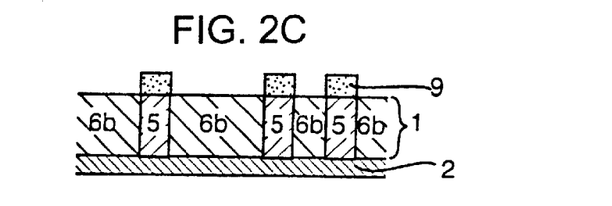

The result of this step is represented in FIG. 2C.

Next, the auxiliary material is removed from the regions between the ridges 5, whereby trenches 6 emerge.

Figure 2D:
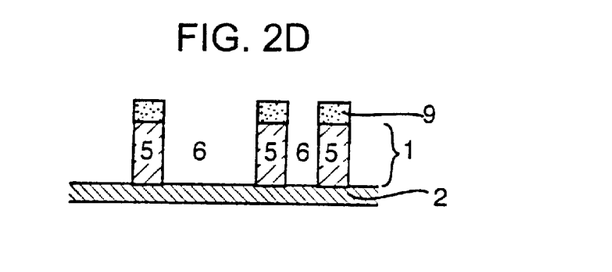

FIG. 2D represents the ridges 5 of working material which remain on the base layer 2 and which are covered by caps consisting of the processing material of the processing layer 9.

In the next step, the polymerization is triggered, for instance by the generating of radicals in the processing material. Next, monomers are supplied in a suitable manner.

The processing material of the processing layer 9 expands with the polymerization and begins to cover the trenches 6 proceeding from the ridges 5. Polymerization is ended as soon as the overhanging processing material bridges the trenches 6 whose width is less than a maximum cover width. Trapped monomers are expelled from the covered trenches.

Figure 2E:
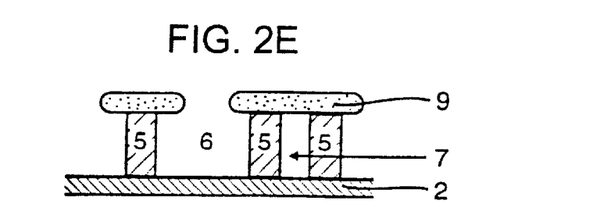

FIG. 2E represents the situation subsequent to the expulsion of the monomers. The former trench on the right-hand side, identified as cavity 7, whose width is less than half the maximum cover width, is completely covered.

The left-hand trench, whose width exceeds the maximum width, is not covered.

Such open trenches are filled in a later step, typically in the deposition of a coverlayer to reinforce the polymerized processing layer.

The capacitive coupling of two conductive tracks which are developed from ridges 5 is dependent on the permittivity of the material separating the tracks and the spacing of the tracks from one another. Given a greater spacing of the tracks, a higher permittivity of the material between the tracks can be allowed in order to achieve the same capacitive coupling.

As long as the open trenches are filled with a material of low permittivity, there is no disadvantage to such open structures in practice.

The various subfigures of FIG. 3 represent a second variant of the The method according to the invention. Here, a compact, homogenous working layer 1 consisting of a working material is deposited on a base layer 2, and the monomers are supplied in gaseous phase during the polymerization.

Figure 3A:
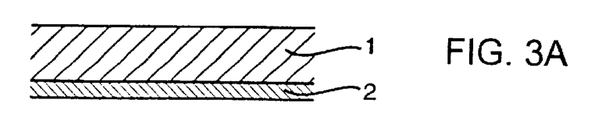
FIG. 3: a schematic representation of the essential steps of a second embodiment of the inventive method.

FIG. 3A represents the homogenous working layer 1 which is deposited on the base layer 2. A processing layer 9 consisting of the processing material is subsequently deposited on the working layer 1.

Figure 3B:
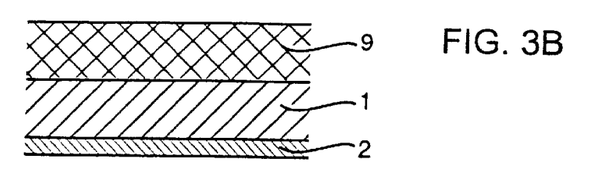

The result of the latter step is represented in FIG. 3B. In the next step, a photoresist 4 is deposited on the processing layer 9 and structured, i.e., it is exposed and developed.

Figure 3C:
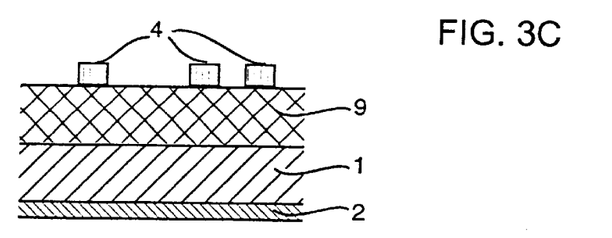

The status after the structuring of the photoresist 4 is represented in FIG. 3C. The photoresist 4 is reinforced, as necessary, prior to the next step, namely, the imaging of the structure of the photoresist 4 into the processing layer 9.

Figure 3D:
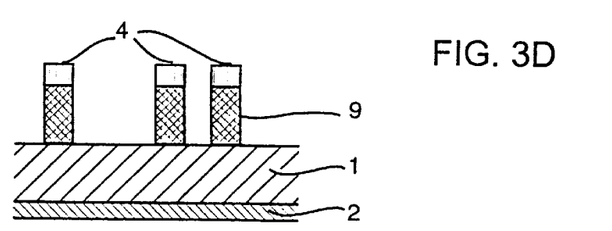

FIG. 3D represents the processing layer 9, now structured, on the still unstructured working layer 1, including residual portions of the photoresist 4. The structure is subsequently imaged into the working layer 1, whereby the photoresist 4 is used up. The photoresist 4 can also be removed in a separate step before or after the structuring of the working layer 1.

Figure 3E:
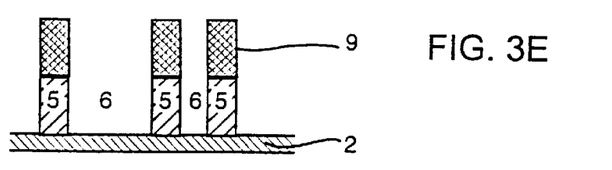

FIG. 3E represents ridges 5 of a working material on the base layer 2, which are covered with residual portions of the processing layer 9. The structures formed by the ridges 5 and the trenches 6 between them have submicrometer dimensions in the vertical and horizontal directions.

A polymerization of the processing material is then triggered by the generation of radicals, and perpetuated by the supplying of monomers in gas form. With the absorption of the monomers, the processing material of the processing layer 9 on the ridges 5 expands and starts to cover the intermediate trenches 6 proceeding from the ridges 5. The polymerization is interrupted as soon as the overhanging processing material covers trenches whose width 6 is less than a maximum cover width. Next, processing residue which is trapped in the covered trenches is expelled.

Figure 3F:
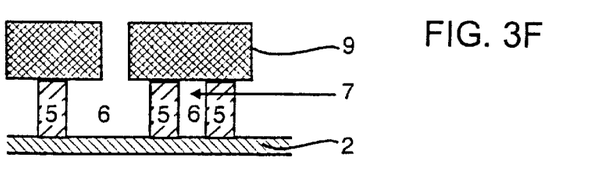

The result of the correspondingly controlled polymerization is represented in FIG. 3F.

A right-hand former trench with a width of less than the maximum cover width, which is referenced as cavity 7, is completely covered. On the other hand, a left-hand trench with a width exceeding the maximum cover width is not completely covered.

Open trenches 6 are filled in the subsequent deposition of a coverlayer for reinforcing the polymerized processing layer.

The various subfigures of FIG. 4 outline the inventive method in a third variant. Here, the working layer 1 is deposited as a compact prestructured working layer on a base layer 2, and the polymerization is controlled in a solution.

Figure 4A:
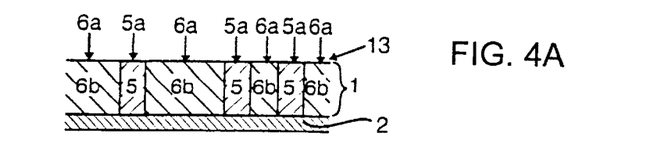
FIG. 4: a schematic representation of the essential steps of a third embodiment of the inventive method.

FIG. 4A represents an initially still compact prestructured working layer 1 which is deposited on a base layer 2. First portions 5 consisting of the working material are provided in the working layer 1 in submicrometer dimensions, from which ridges 5 will subsequently be developed. Second portions 6b located between the first portions 5 are filled with an auxiliary material. On the surface of the working layer 1 opposite the base layer 2, a working surface 13 is constructed, which is formed in sections from the surfaces 5a of the first portions 5 and the surfaces 6a of the second portions 6b.

An active processing sublayer 11 consisting of a polymerizable processing material, a passive processing sublayer 12 consisting of an amorphous hydrocarbon (a-C(H)-layer), and an auxiliary photoresist 14 are successively deposited surface-wide on the working surface.

Figure 4B:
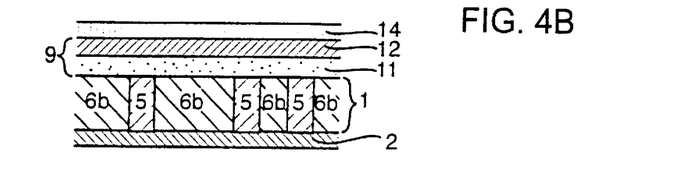

A layer system as represented in FIG. 4B emerges. The auxiliary photoresist 14 is structured by a lithographic technique. The structuring is performed in such a way that residual portions of the auxiliary photoresist 14 remain over portions of the working surface 13 formed by the surfaces 5a of the first portions 5 and are separated from the working surface 13 by the two processing sublayers 11, 12.

Figure 4C:
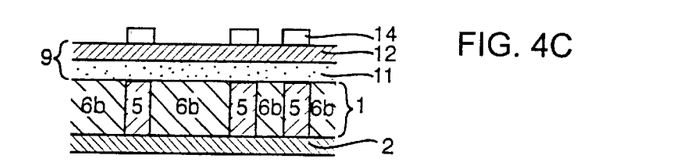

The layer system with a correspondingly structured auxiliary photoresist 14 is represented in FIG. 4C.

The auxiliary photoresist 14 is then reinforced against the next step. In the next step, the two processing sublayers 11,12 are structured according to the overlying structure of the auxiliary photoresist 14.

Figure 4D:
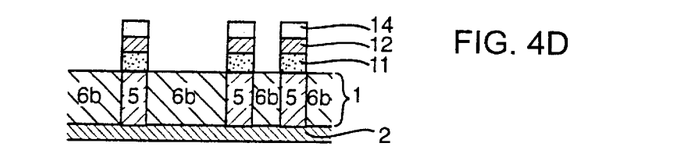

FIG. 4D represents the layer system after the structuring of the processing sublayers 11,12. Residual portions of the photoresist 14 lie on residual portions of the processing sublayers 11,12.

The residual portions of the auxiliary photoresist 14 are removed in the next step.

Figure 4E:
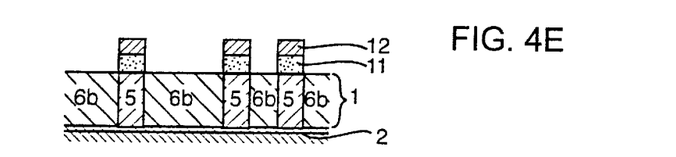

FIG. 4E represents the layer system after the removal of the auxiliary photoresist 14.

Next, the auxiliary material of the second portions 6b is removed, whereby trenches 6 and ridges 5 emerge.

Figure 4F:
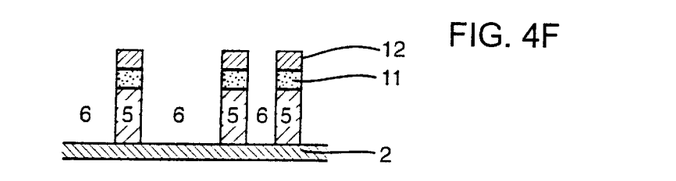

FIG. 4F represents the ridges 5 of the working material remaining on the base layer 2, which are covered by double-layer caps consisting of the polymerizable processing material of the active processing sublayers 11 and the material of the passive processing sublayer 12, and between the ridges 5, trenches.

The layer system represented in FIG. 4F is covered with a processing liquid 8 containing monomers at least up to the top edge of the active processing sublayer 11, and then irradiated with light of a wavelength that triggers polymerization.

A polymerization is triggered by the exposure at surfaces of the active processing sublayer 11 which are oriented vertical to the base layer 2 and which are uncovered subsequent to the structuring.

Figure 4G:
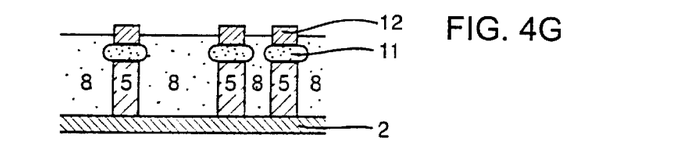

As represented in FIG. 4G, the polymerizing processing material of the active processing sublayer 11 begins to expand parallel to the base layer 2 and to cover adjoining trenches 6 proceeding from the surface of the ridges 5. The residual portions of the passive processing sublayer 12 thereon initially inhibit a polymerization in the vertical direction, i.e. perpendicular to the base layer 2. The monomers which participate in the polymerization are contained in the processing liquid 8.

Figure 4H:
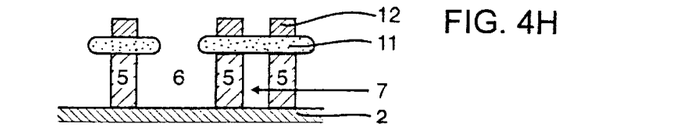

As represented in FIG. 4H (right-hand side), trenches whose width is less than the maximum cover width are covered. The processing liquid 8 is removed from the cavities 7 that emerged with the covering of trenches 6 in that it is expelled through the polymerized processing layer 11 in gas form.

In a further step, a dielectric coverlayer is deposited, whereby uncovered trenches are filled with the dielectric material of the coverlayer. A structure with a coverlayer 10 is obtained as represented in FIG. 1.

EXAMPLE 1

FIG. 2

A base layer consisting of silicon nitride is deposited on the surface of a silicon wafer. Next, a silicon dioxide layer with a thickness of 200 nm is deposited on the silicon nitride layer and structured by electron beam lithography. Auxiliary trenches are thus formed in the silicon dioxide layer, which are 100 nm wide and 200 nm deep and which reach the silicon nitride layer.

Copper is sputtered onto the structures so generated until at least the auxiliary trenches are completely filled with copper. The copper that protrudes beyond the auxiliary trenches is then ground to the top edge of the auxiliary trenches.

A compact prestructured working layer emerges, wherein the future copper ridges are fully developed, and silicon dioxide is located between the ridges as an auxiliary material. On the surface of the working layer opposite the silicon nitride layer, a working surface is constructed, which is composed, in sections, of the surfaces of the copper ridges and the surfaces of the trenches that are filled with silicon dioxide.

The working layer is varnished with a positively structurable polybenzoxazole with hexafluorisopropyl groups. The polybenzoxazole is removed by lithography from the portions of the working surface formed from the surfaces of the trenches that are filled with silicon dioxide.

Next, the silicon dioxide between the copper ridges is etched out with a buffered fluorocarbon solution, so that freestanding copper ridges which are covered with the polybenzoxazole emerge on the silicon nitride layer.

The polymerization is performed as a graft polymerization in a reactor chamber of a PECVD apparatus with a parallel plate configuration given a surface area ratio of 1:1.

The polymerization is started in that a hydrogen plasma is ignited with a power of 200 W at a pressure of 0.2 mbar for 30 seconds.

The polymerization is perpetuated in that styrol is subsequently supplied as the monomer gas, and for two minutes the pressure in the reactor chamber is raised to 200 mbar. No plasma is ignited in this step.

The cycle of starting and perpetuating the plasma polymerization is repeated five times. The polymerizing polybenzoxazole covers adjoining trenches starting at the surface of the copper ridges.

Next, the silicon wafer is heated for 20 minutes to 200° C. in a vacuum in order to end the polymerization and pump out trapped monomer gas.

Inspection by X-Ray Electron Beam Microscopy reveals that the 100-nm-wide trenches are covered by the polymer of the processing layer, and thus cavities have emerged from the trenches.

A polybenzoxazole is deposited over the polymerized processing layer as a coverlayer. Vias to the copper ridges can subsequently be etched by a conventional lithography technique, since the material of the polymerized processing layer and the material of the coverlayer are etchable by identical means.

Once the vias are filled with a metal, a functional plane is closed on the silicon wafer consisting of the base layer, the working layer (which functions as an interconnect layer), and a dielectric layer (which consists of the polymerized processing layer and the coverlayer).

Additional functional planes are similarly arranged on a functional plane of the silicon wafer.

EXAMPLE 2

FIG. 3

A base layer consisting of silicon nitride is deposited on the surface of a silicon wafer. Next, a copper layer with a thickness of 200 nm is sputtered onto the silicon nitride layer surface-wide. The copper layer corresponds to a compact, homogenous working layer.

A processing layer is deposited on the copper layer in a reactor chamber of a PECVD apparatus by a PECVD method with the processing gasses ethene and octafluorcyclobutane. The material of the processing layer is an amorphous partly fluorinated hydrocarbon (a-C:H(F)) with a band gap of greater than 2 eV.

The processing layer is varnished with a CARL electron beam resist. The CARL electron beam resist is subsequently structured in a lithography method and then silylated. With the silylation, the CARL electron beam resist is reinforced against the following step, an oxygen etching of the processing layer.

The processing layer is structured according to the structure of the CARL electron beam resist by the etching in oxygen plasma.

Lastly, the structure of the processing layer is transferred into the copper layer by ion beam etching. Residual portions of the CARL electron beam resist are thereby used up. Trenches with a width of 100 nm emerge in the copper layer.

The polymerization is controlled in the reactor chamber of the PECVD apparatus as a graft polymerization.

The polymerization is started in that a hydrogen plasma is ignited with a power of 200 W for 30 seconds given a pressure of 0.2 mbar. Radicals thus emerge with the etching of the surface of the processing layer.

The polymerization is perpetuated in that styrol is introduced as a monomer gas, and for two minutes the pressure in the reactor chamber is raised to 200 mbar.

The cycle of starting and perpetuating the plasma polymerization is repeated five times.

Next, the silicon wafer is heated for 20 minutes to 200° C. in a vacuum in order to end the polymerization and pump out trapped monomer gas.

Inspection by X-Ray Electron Beam Microscopy reveals that the 100-nm-wide trenches are covered by the polymerized processing layer.

A dielectric coverlayer is deposited over the polymerized processing layer.

A functional plane of the silicon wafer can then be generated the same way as in Example 1.

EXAMPLE 3

FIG. 4

A base layer consisting of silicon nitride is deposited on the surface of a silicon wafer. Next, a silicon dioxide layer with a thickness of 200 nm is deposited on the silicon nitride layer and structured by electron beam lithography. Auxiliary trenches are thus formed in the silicon dioxide layer, which are 100 nm wide and 200 nm deep and which reach the silicon nitride layer.

Copper is sputtered onto the structures so generated until at least the auxiliary trenches are completely filled with copper. The copper that protrudes beyond the auxiliary trenches is then ground to the top edge of the auxiliary trenches.

A compact prestructured working layer emerges, wherein the future copper ridges are fully developed, and silicon dioxide is located between the ridges as an auxiliary material. On the surface of the working layer opposite the silicon nitride layer, a working surface is constructed, which is composed, in sections, of the surfaces of the copper ridges and the surfaces of the trenches that are filled with silicon dioxide.

The working layer is varnished with a polymerizable processing material. The polymerizable processing material forms a 100-nm-thick active processing sublayer. The processing material consists of a solvent with a 10% proportion of isopropyl styrol and a 1% proportion of a benzophenone derivative as a sensitizer.

A passive processing sublayer with a thickness of approx. 50 nm consisting of an amorphous hydrocarbon (a-C:H) is then deposited on the active processing sublayer, and an auxiliary photoresist is deposited on this.

The auxiliary photoresist is a CARL electron beam resist which is structured by a lithographic method and then silylated.

The structuring of the CARL electron beam resist is carried out in such a way that residual portions of the CARL electron beam resist are created over portions of the working surface formed by the surfaces of the copper ridges, said resist portions being separated from the working surface by the two processing sublayers.

The structures of the CARL electron beam resist are transferred into the a-C:H layer and the active processing sublayer by the etching in oxygen plasma.

Next, the residual portions of the CARL electron beam resist are flood-lit and stripped in an alkaline developer.

Next, the silicon dioxide between the copper ridges is etched out with a buffered fluorocarbon solution, so that freestanding copper ridges emerge on the silicon nitride layer, which are covered with double-layer caps consisting of the processing material and the a-C:H layer.

The polymerization is carried out as graft polymerization in an argon-flushed glove box.

To that end, the silicon wafer is covered with an oxygen-free solution of 10% styrol in benzol and exposed to light with a wavelength of 365 nm.

With the exposure, radicals emerge at the uncovered surfaces of the active processing sublayer facing the trenches.

A polymerization of the styrol solution is triggered by the radicals at the active processing sublayer. The active processing sublayer thus expands and covers the adjoining trenches.

Next, the silicon wafer is flushed with cyclohexane and heated in a vacuum for 20 minutes to 200° C.

The polymerization is stopped by the heating. At the same time, residues of the styrol solution are removed from cavities that emerged with the covering of the trenches.

We claim:

1. A method of forming structured cavities with submicrometer dimensions in a cavity layer of a semiconductor device, which comprises the following steps:
    depositing an initially compact working layer on a base layer, the working layer being formed, at least in sections thereof, of a working material;
    depositing a processing layer on the compact working layer to form a double layer from the working layer and the processing layer, the processing layer containing polymerizable processing material;
    structuring the double layer to form ridges of submicrometer dimensions of the working material covered by the processing material, and to form trenches between the ridges;
    polymerizing the processing material and growing additional material on mutually adjacent ridges, to cover respective trenches between the ridges, and forming cavities; and
    expelling processing residue from the cavities.

2. The method according to claim 1, which comprises forming the base layer as an etch stop layer.

3. The method according to claim 1, whereby the working material is a conductive material.

4. The method according to claim 1, which comprises forming the trenches down to the base layer.

5. The method according to claim 1, which comprises controlling the polymerization as a graft polymerization.

6. The method according to claim 1, which comprises depositing the compact working layer as a homogenous layer of the working material, and wherein the step of structuring the double layer comprises the following steps:
    depositing a photoresist on the processing layer;
    structuring the photoresist to form a structured photoresist;
    imaging the structured photoresist onto the processing layer to form a structured processing layer; and
    imaging the structured processing layer onto the working layer.

7. The method according to claim 6, which comprises using up the photoresist in the step of structuring of the working layer.

8. The method according to claim 6, wherein the processing material of the processing layer is an amorphous hydrocarbon with a band gap of greater than 2 eV.

9. The method according to claim 6, which comprises amplifying an etch resistance of the photoresist after structuring thereof.

10. The method according to claim 1, wherein the initially compact working layer comprises first portions formed from the working material, and second portions composed of an auxiliary material between the first portions, and wherein the step of structuring of the double layer comprises the following steps:
    structuring the processing layer, whereby residual portions of the processing material remain exclusively on the first portions of the working layer; and
    removing the auxiliary material.

11. The method according to claim 10, wherein the processing material is a positive polybenzoxazole photoresist.

12. The method according to claim 10, which comprises forming the processing layer as a processing double layer with an active processing sublayer of a polymerizable material and a passive processing sublayer on the active processing sublayer, and wherein the step of structuring the double layer comprises the following steps:
    depositing an auxiliary photoresist;
    structuring the auxiliary photoresist; and
    imaging a structure of the auxiliary photoresist onto the processing layer.

13. The method according to claim 12, which comprises removing the auxiliary photoresist after structuring the processing layer.

14. The method according to claim 12, wherein the active processing sublayer comprises a sensitizer.

15. The method according to claim 12, wherein the passive processing sublayer is a layer of amorphous hydrocarbon.

16. The method according to claim 12, which comprises amplifying an etch resistance of the auxiliary photoresist after structuring thereof.

17. The method according to claim 1, wherein the polymerizing step comprises:
    triggering a polymerization; and
    perpetuating the polymerization.

18. The method according to claim 17, which comprises repeating the triggering and perpetuating steps until an overhanging processing material that expands with the polymerization and that is located on adjacent ridges of the working layer covers trenches having a width less than a maximum cover width.

19. The method according to claim 17, wherein the polymerization is triggered by exposure.

20. The method according to claim 17, wherein the polymerization is triggered by radical starter compounds.

21. The method according to claim 17, which comprises supplying monomers contributing to the polymerization in a solution.

22. The method according to claim 17, which comprises supplying monomers contributing to the polymerization in gaseous form.

23. The method according to claim 1, which comprises expelling the processing residues from the cavities at a given temperature.

24. The method according to claim 1, which comprises terminating the polymerization at a given temperature.

25. The method according to claim 23, which comprises expelling the processing residues from the cavities at a temperature equalling the given temperature.

26. The method according to claim 1, which comprises depositing a dielectric coverlayer on the polymerized processing layer.

27. The method according to claim 26, wherein the dielectric coverlayer is formed of a material that can be removed together with a material of the processing layer.

28. The method according to claim 12, which comprises depositing a dielectric coverlayer on the polymerized processing layer, the dielectric coverlayer being formed of a material that can be removed together with a material of the processing sublayers of the processing layer.

29. The method according to claim 1, which comprises forming the working layer with at least one active processing sublayer consisting of a polymerizable material.

30. The method according to claim 1, which comprises forming the working layer of a polymerizable material.

* * * * *